US007365265B2

(12) United States Patent
Heremans et al.

(10) Patent No.: US 7,365,265 B2
(45) Date of Patent: Apr. 29, 2008

(54) THERMOELECTRIC MATERIALS COMPRISING NANOSCALE INCLUSIONS TO ENHANCE SEEBECK COEFFICIENT

(75) Inventors: Joseph Pierre Heremans, Troy, MI (US); Christopher M. Thrush, Shelby Township, Macomb County, MI (US); Donald T. Morelli, White Lake, MI (US)

(73) Assignee: Delphi Technologies, Inc., Troy, MI (US)

( * ) Notice: Subject to any disclaimer, the term of this patent is extended or adjusted under 35 U.S.C. 154(b) by 365 days.

(21) Appl. No.: 11/152,664

(22) Filed: Jun. 14, 2005

(65) Prior Publication Data

US 2005/0284512 A1 Dec. 29, 2005

Related U.S. Application Data

(60) Provisional application No. 60/579,454, filed on Jun. 14, 2004.

(51) Int. Cl.
*H01L 35/16* (2006.01)
*H01L 35/34* (2006.01)

(52) U.S. Cl. ............... 136/238; 136/239; 136/201; 252/62.3 T; 977/779; 977/948

(58) Field of Classification Search ............ 136/238, 136/239; 252/62.3 T; 420/84–86; 977/778, 977/779, 948
See application file for complete search history.

(56) References Cited

U.S. PATENT DOCUMENTS 3,285,019 A * 11/1966 Henderson et al. ......... 62/3.7
6,444,896 B1 * 9/2002 Harman et al. ............ 136/239
2002/0026856 A1 * 3/2002 Suzuki et al. ................ 75/343

OTHER PUBLICATIONS

D. B. Evans et al, "An Electron Microprobe Study of Inclusions in Lead Telluride Thermoelectric Elements", NASA TN D-5415, Nov. 1969.*

* cited by examiner

*Primary Examiner*—Nam Nguyen
*Assistant Examiner*—Jeffrey Barton
(74) *Attorney, Agent, or Firm*—Patrick M. Griffin

(57) ABSTRACT

A thermoelectric material having enhanced Seebeck coefficient is characterized by a microstructure comprising nanoscale Pb inclusions dispersed in matrix substantially composed of PbTe. The excess Pb is obtained either by adding Pb in an amount greater than the stoichiometric amount needed to form PbTe, or by adding an additive effective to getter Te so as to produce the desired excess. The method is generally applicable to enhance thermoelectric properties of compounds of Pb, Sn or Ge, and Te, Se, or S.

18 Claims, 5 Drawing Sheets

THERMOELECTRIC MATERIALS COMPRISING NANOSCALE INCLUSIONS TO ENHANCE SEEBECK COEFFICIENT

CROSS REFERENCE TO RELATED APPLICATION

This application claims the benefit of U.S. Provisional Application No. 60/579,454, filed Jun. 14, 2005, which is incorporated herein by reference.

TECHNICAL FIELD OF INVENTION

This invention relates to thermoelectric materials, and more particularly thermoelectric materials composed of PbTe or the like and containing nanoscale inclusions effective to enhance the Seebeck coefficient.

BACKGROUND OF INVENTION

Thermoelectric materials are known that convert thermal energy directly into electrical energy or vice versa. The efficiency of a thermoelectric material is characterized by "The Thermoelectric Figure of Merit," which is defined as the square of its Seebeck coefficient times its electrical conductivity divided by its thermal conductivity. The Seebeck coefficient is a measure of the "thermoelectric pumping power", i.e. the amount of heat that a material can pump per unit of electrical current. The electrical conductivity is a measure of electrical losses in a material, and the thermal conductivity is a measure of heat that is lost as it flows back against the heat pumped by a material.

A relatively high-efficiency thermoelectric material has been proposed that includes PbSeTe/PbTe quantum dot superlattice (QDSL) structures. The combination of a relatively larger power factor with low lattice thermal conductivity provides a significant increase in the thermoelectric figure of merit for these QDSL structures compared to their bulk alloys. The proposed QDSL structures are prepared using molecular beam epitaxy or MBE. U.S. patent application Ser. No. 10/808,180, filed Mar. 24, 2004, incorporated herein by reference, describes a methodology for producing bulk PbTe-based structures having useful thermoelectric properties. The PbTe structures are prepared by grinding PbTe material to form a powder, and pressing and sintering the powder. The resulting sintered microstructure was found to contain nanometer-sized grains that enhanced the thermopower, which was attributed to the selective scattering of electrons depending on their energy.

While the aforementioned thermoelectric material exhibits an enhanced Seebeck coefficient, there exists a need for still further improvement in the thermoelectric performance of materials produced by bulk processes. Moreover, it is desired to provide a method for manufacturing thermoelectric materials that does not require powder methodology.

SUMMARY OF THE INVENTION

In accordance with this invention, a thermoelectric material has a microstructure characterized by a matrix and inclusions dispersed in the matrix. The matrix is substantially composed of a MA compound, wherein M is selected from the group consisting of lead, Pb; tin, Sn; and germanium, Ge; and A is selected from the group consisting of tellurium, Te; selenium, Se; and sulfur, S. A preferred compound is lead telluride, PbTe. The inclusions are composed of M in an amount in excess of the quantity required for forming the matrix. The excess M is obtained either by adding M in an amount greater than the stoichiometric amount needed to form MA, or by adding an additive effective to getter A so as to produce the desired M excess. The microstructure includes inclusions having maximum dimension less than 100 nanometers, referred to herein as nanoscale inclusions. Preferably, at least 50 percent of the inclusions are between 10 and 35 nanometers. The nanoscale inclusions are present in an amount up to about 33 percent by volume, preferably between 3 and 20 percent. It is found that the formation of nanoscale inclusions significantly improves the Seebeck coefficient of the material.

In one aspect of this invention, a method is provided for forming a thermoelectric material composed of MA compound, wherein M is selected from the group consisting of Pb, Sn and Ge, and A is selected from the group consisting of Te, Se and S. The method comprises forming a melt of M and A wherein M is present in an amount greater than a stoichiometric amount for forming the MA compound. The melt is solidified to produce a thermoelectric material having a microstructure characterized by nanoscale inclusions dispersed in a matrix substantially composed of MA compound. The nanoscale inclusions are composed of elemental M, have a maximum dimension less than 100 nanometers, and are present in an amount up to about 33 percent by volume.

BRIEF DESCRIPTION OF DRAWINGS

This invention will be further described with reference to the accompanying drawings in which.

DETAILED DESCRIPTION OF INVENTION

In accordance with a preferred embodiment of this invention, thermoelectric material having enhanced Seebeck coefficient was formed from lead telluride, PbTe, formulations containing lead in an amount greater than the stoichiometric quantities. Preferably, excess lead was obtained by addition of a tellurium getter, such as silver, Ag. The getter addition results in excess lead over stoichiometric amounts and thereby produces nanoscale lead inclusions dispersed in a PbTe matrix. As used herein, nanoscale inclusions refer to inclusions characterized by a maximum dimension less than 100 nanometers. Preferably, at least 50% by volume of the inclusions have a maximum dimension between about 10 and 35 nanometers. It is found that thermoelectric material having the nanoscale inclusions exhibits a significant increase in Seebeck coefficient as compared to stoichiometric PbTe material.

By way of a preferred example, a sample was prepared by adding a minor amount of Ag to a stoichiometric PbTe formulation. Pb shot, Te chips and Ag powder were added in the following proportions, based upon atomic percent, 49.5% Pb, 49.5% Te, and 1% Ag. The metals were heated above the melting points of all constituents in an open crucible in an inert atmosphere and then quickly cooled. The resulting material is enriched with Pb relative to stiochiometric proportions, due to a reaction between Ag and Te to form $Ag_2Te$. The presence of elemental Pb was confirmed by an x-ray diffraction pattern. Also, the material was observed to exhibit superconductivity below 7° K. The Ag-containing material was characterized by n-type conductivity and an electron concentration of $8\times10^{19}$ cm$^{-3}$. To reduce the electron concentration, an amount of 3 grams of Ag-containing material was mixed with 10 grams of PbTe chips commercially available from Alfa Corporation under catalog # 88285. The mixture was heated at 1000° C. overnight under a vacuum of <1.0E-5 Torr inside of a quartz ampoule. The ampoule was slowly cooled at a rate of 0.1° C. per minute to 900° C., to solidify the semiconductor material. Thereafter further cooled to ambient temperature. The resulting material is referred to as sample 78.

Figure 1:
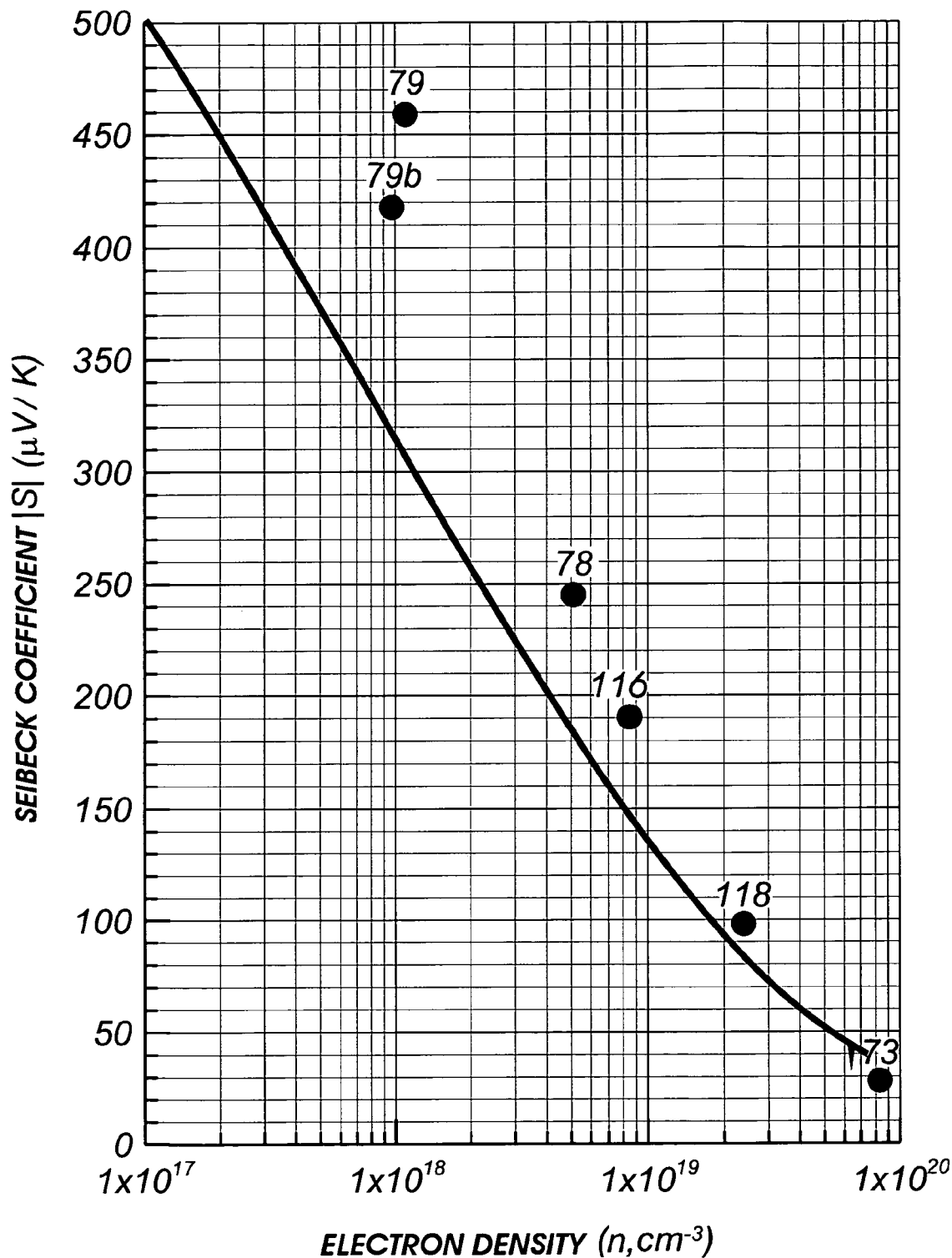
FIG. 1 is a graph showing Seebeck coefficient as a function of electron mobility for PbTe materials in accordance with this invention.

FIG. 1 is a graph showing Seebeck coefficient, in microvolts per degree Kelvin, as a function of electron concentration per cubic centimeter, for PbTe materials at ambient temperature. The solid line indicates the Seebeck coefficient for conventional PbTe formed by traditional crystal growth techniques. Hall measurements were carried out on sample 78 to determine carrier concentration and Seebeck coefficient. The results are shown in FIG. 1 for sample 78 and demonstrate a substantial increase in Seebeck coefficient. For purposes of comparison, a sample 73 having a composition similar to the above material containing 1 percent silver was prepared and cooled rapidly to prevent formation of nanoscale Pb inclusions, and showed a Seebeck coefficient similar to conventional material.

To further illustrate the dependence of the Seebeck coefficient in samples containing nanoscale inclusions, additional samples 116, 118B.; and 118N were prepared by the process described for sample 78, but having varied electron conductivity. It will be understood that minor variations in tellurium vacancies during processing result in significant variations in electrical conductivity. Seebeck coefficients are shown in FIG. 1 and are increased relative to comparable material formed without Ag addition or Pb inclusions.

Figure 2:
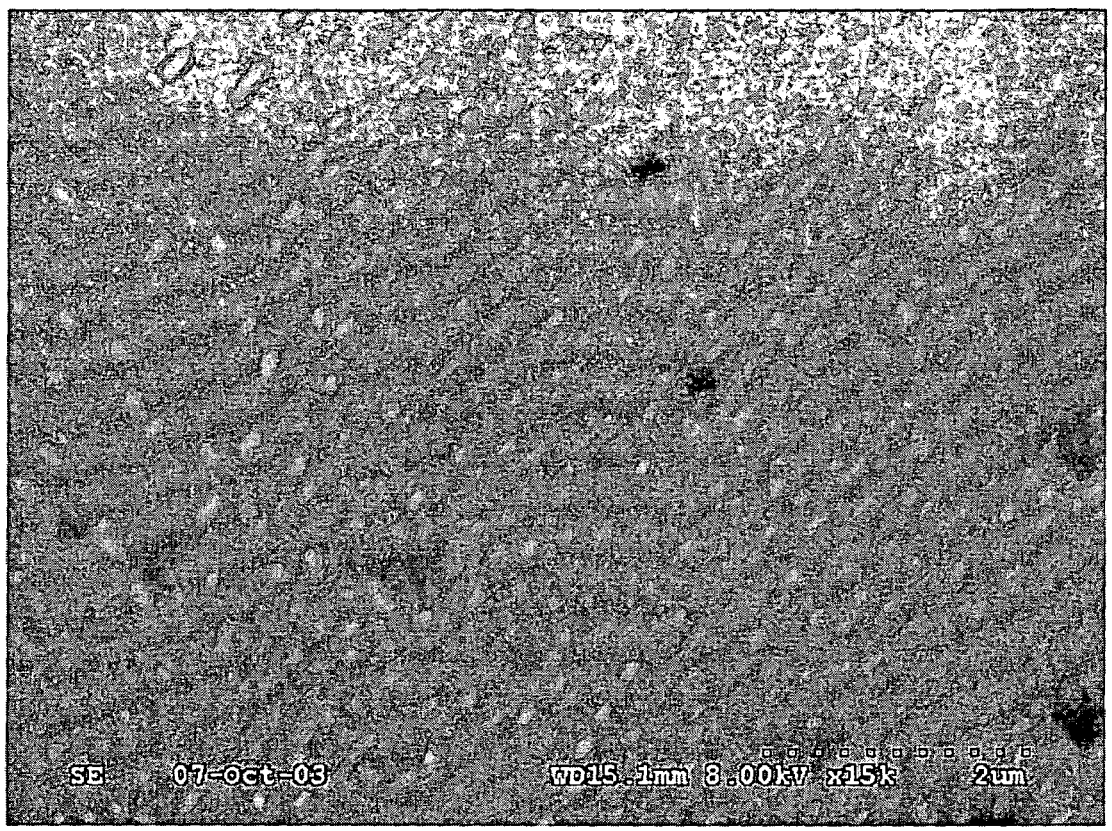
FIG. 2 is a photomicrograph obtained using a scanning electron microscope and showing PbTe materials in accordance with this invention.

Sample 116 was examined by scanning electron microscope. As shown in FIG. 2, the SEM image reveals light colored precipitates dispersed in a gray matrix. In general, the precipitates had maximum dimensions less than 100 nanometers. It is pointed out that the dark gray craters are believed to be thermal etch pits formed during preparation of the sample for SEM imaging.

Figure 3:
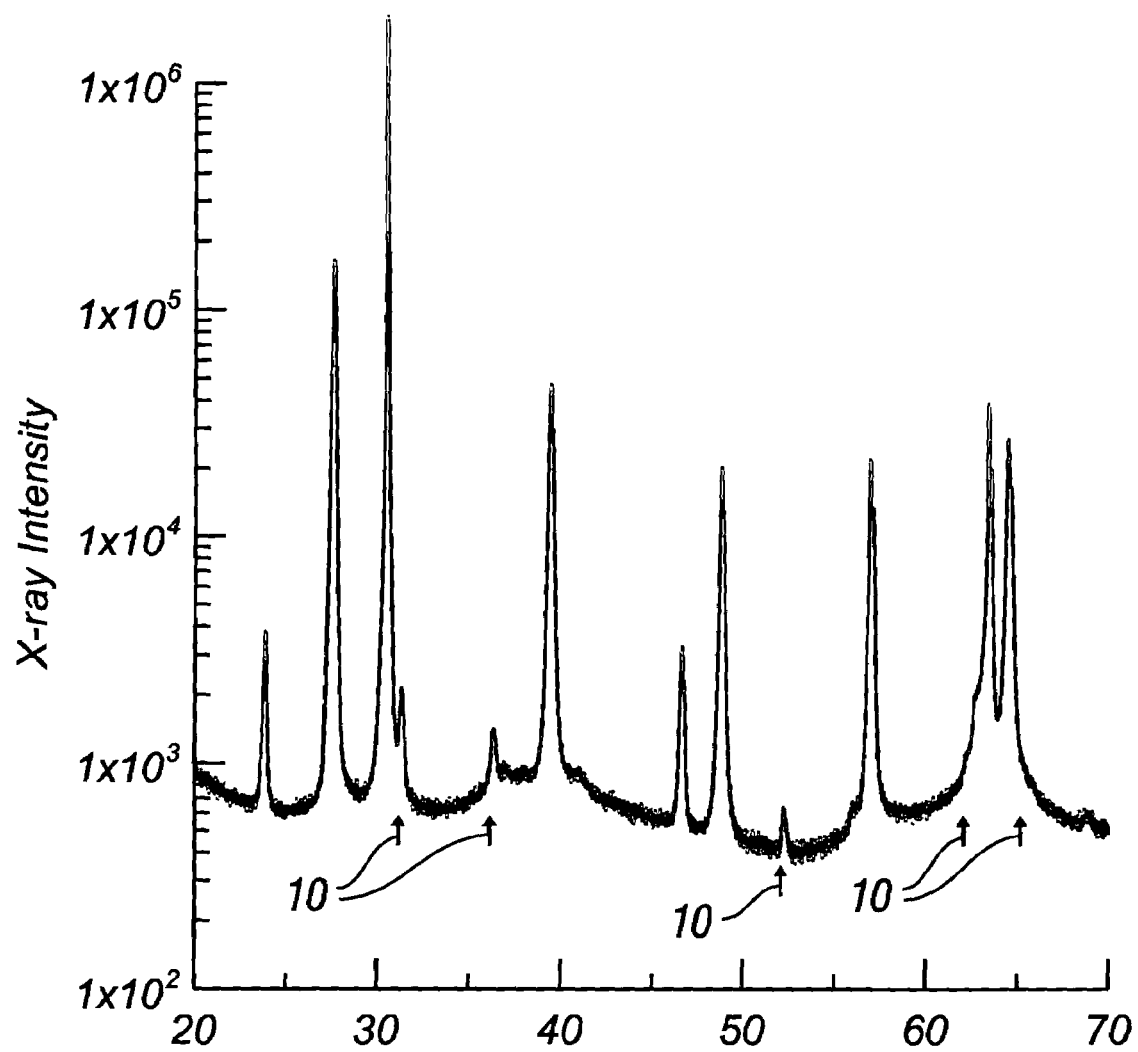
FIG. 3 is an x-ray diffraction pattern for a PbTe material in accordance with this invention.

FIG. 3 is an x-ray diffraction pattern of sample 116, showing the both PbTe and elemental Pb. Peaks indicated by arrows 10 are attributed to the elemental Pb. Sample 116 was also observed to be superconducting below 7° K.

In a further example of this invention, a sample of PbTe material was prepared by compacting and sintering a powder. The powder was prepared by pulverizing sample 78 using a motar and pestle to form coarse particles, and then ball milling the coarse particles to form a fine powder using a ball mill with n-heptane and zirconia balls. This powder was then isostatically pressed into two pellets, and the resulting pellets placed in a quartz ampoule. The pellets were subjected to a $H_2$ thermal cleaning process to remove oxygen, and the ampoule was subsequently partially backfilled with an $H_2$ atmosphere. The material were then sintered for 161 hours at 347° C. The resulting material is shown as samples 79 and 79b in FIG. 1 and exhibited dramatically enhanced Seebeck coefficient.

Figure 4:
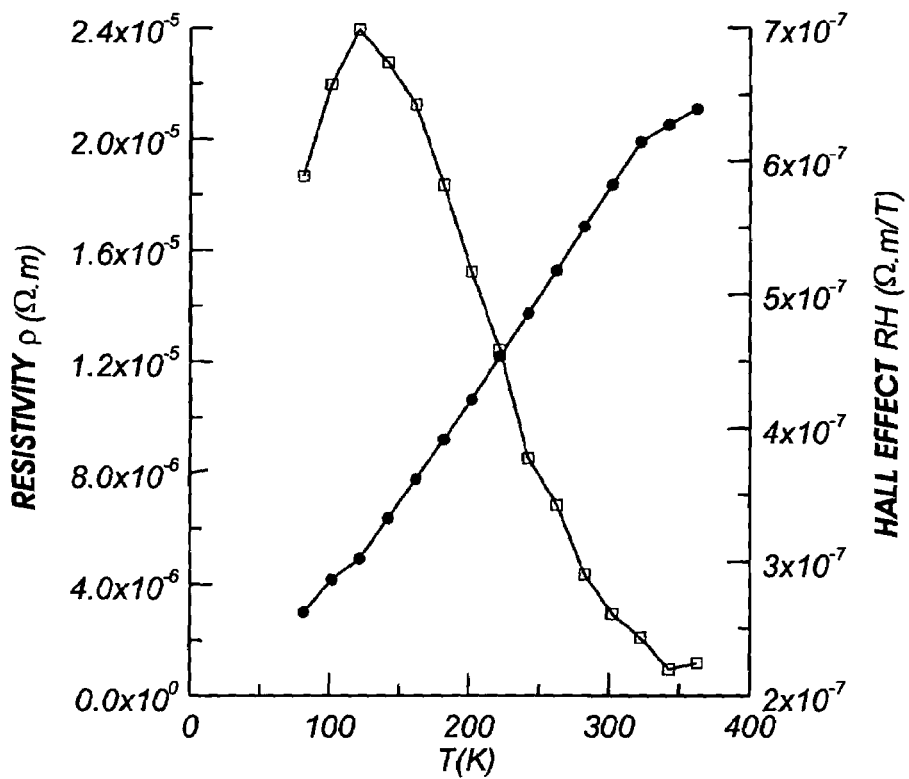
FIG. 4 is a graph showing resistivity and Hall effect as a function of temperature for PbTe materials in accordance with this invention.
Figure 5:
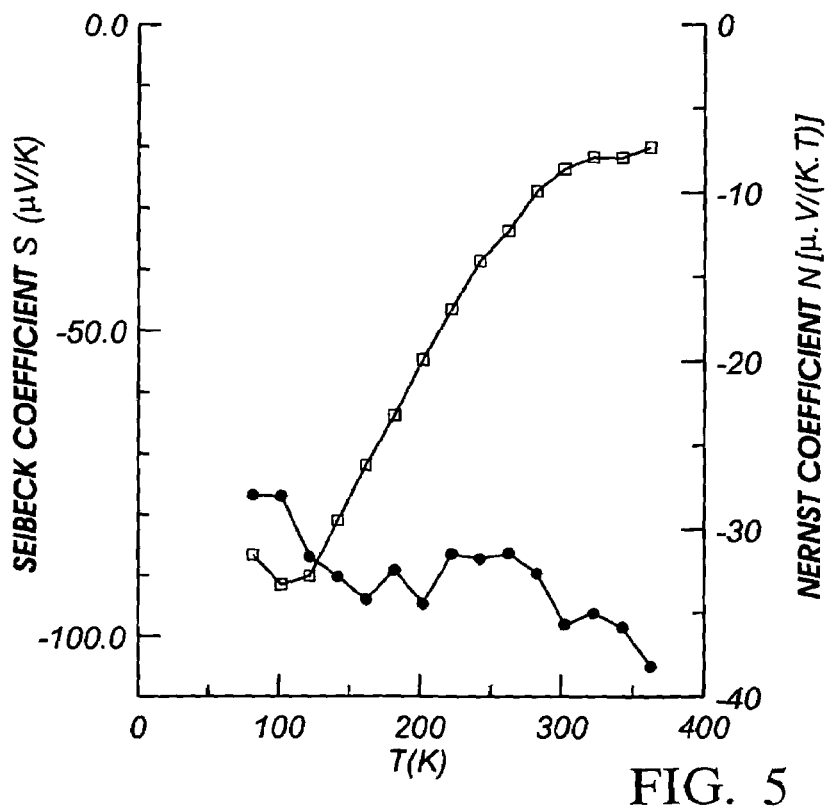
FIG. 5 is a graph showing Seebeck coefficient and Nernst coefficient as a function of temperature for PbTe materials in accordance with this invention.
Figure 6:
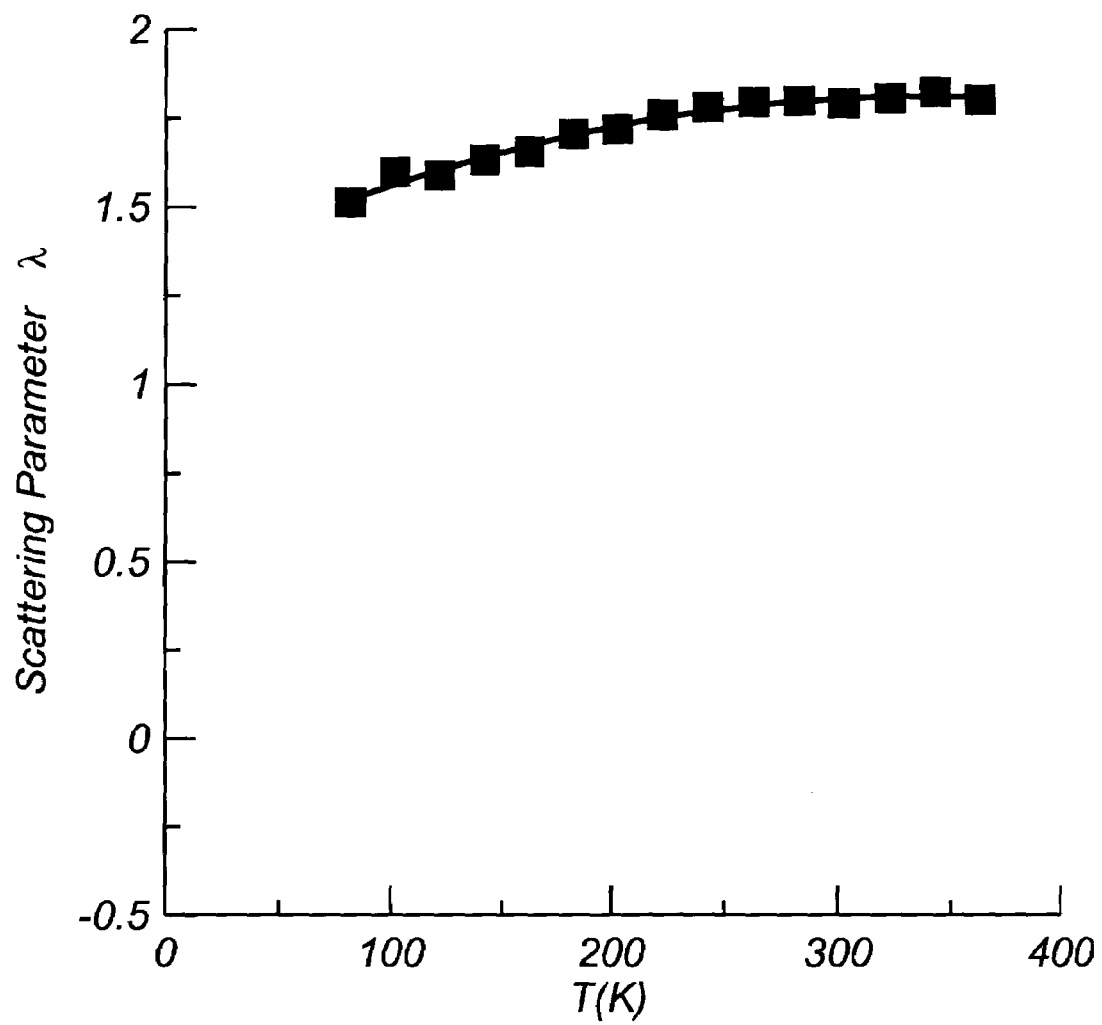
FIG. 6 is a graph showing scattering parameter as a function of temperature for PbTe materials in accordance with this invention.

FIG. 4 shows electrical resistivity and Hall coefficient as a function of temperature for sample 118. FIG. 5 shows Seebeck coefficient and Nernst coefficient as a function temperature, also for sample 118. It will be appreciated that the Nernst effect allows direct determination of the scattering parameter. From these values, electron mobility, density, effective mass, and scattering parameter may be calculated, see Yu. I. Ravich, B. A. Efimova, and I. A. Smirnov, Semiconducting Lead Chalcogenides (Plenum, N.Y., 1970). The resulting scattering parameter as a function of temperature, assuming a parabolic band structure, is shown in FIG. 6.

While not wishing to be limited to any particular theory, it is believed that, in the above examples, lead in amounts greater than stoichiometric forms precipitates or inclusion of dimensions less than 100 nm. When an electrical current is conducted through the material, the inclusions scatter electrons, thus altering the scattering parameter (the exponent of the energy dependence of the electron scattering time) and increasing the Seebeck coefficient.

In the examples, the thermoelectric material was based upon PbTe compound. This invention may be employed to enhance other suitable thermoelectric compounds. In general, suitable thermoelectric compounds include compounds characterized by the formula MA, wherein M is a metal selected from Pb, Sn and Ge, and A is selected from Te, Se and S.

In accordance with this invention, nanoscale inclusions are formed by an excess of M over stoichiometric amounts. As used herein, stoichiometric amounts refers to a theoretical amounts for forming MA, e.g., PbTe. Preferably, the excess M is between about 3 and 6 percent. In the examples, excess Pb was obtained by addition of a getter. As used herein, getter refers to a additive having a greater affinity for A than M. A preferred getter is silver. Alternately, excess M may be obtained by additions of M in amounts greater than stoichiometric. In general, it is believed that excess M sufficient to precipitate inclusions in an amount greater than about 3 percent by volume results in significant improvement in Seebeck coefficient. However, large additions, e.g., 33 percent, may result in formation of a continuous phase that would produce an electrical short through the material. A preferred volume of inclusions is between about 5 and 20 percent.

In the described examples, the inclusions were formed by slowly cooling the metal over an extended time to allow diffusion of the excess M and formation of the PbTe matrix. Alternately, the melt may be rapidly cooled and thereafter annealed for a time and at a temperature sufficient to diffuse the excess M to form the desired nanoscale inclusions.

While this invention has been described in terms of the preferred embodiments thereof, it is not intended to be so limited, but rather only to the extent set forth in the claims that follow.

We claim:

1. A thermoelectric material having a microstructure characterized by a matrix and inclusions dispersed in the matrix; wherein the matrix is substantially composed of a MA compound, wherein M is selected from the group consisting of Pb, Sn and Ge, and A is selected from the group consisting of Te, Se and S;

wherein the inclusions are composed of M in an amount in excess of the quantity required for forming the matrix; and wherein the inclusions comprise nanoscale inclusions having a maximum dimension less than 100 nanometers present in an amount up to about 33 percent by volume, based on the total volume of thermoelectric material.

2. A thermoelectric material in accordance with claim 1 wherein the nanoscale inclusions are present in an amount between 3 and 20 percent.

3. A thermoelectric material in accordance with claim 1 wherein the matrix is substantially formed of lead telluride.

4. A thermoelectric material in accordance with claim 3 wherein the material contains a tellurium getter in an amount sufficient to produce Pb in excess of the stoichiometric amount.

5. A thermoelectric material in accordance with claim 1 wherein at least 50percent of the nanoscale inclusions are characterized by a maximum dimension between about 10 and 35 nanometers.

6. A thermoelectric material in accordance with claim 1 wherein the material further comprises an addition of a getter having an affinity for A greater than M in an amount sufficient to produce an excess of M over stoichiometric amounts.

7. A thermoelectric material in accordance with claim 6 wherein the getter is silver.

8. A thermoelectric material having a microstructure characterized by a matrix and inclusions dispersed in the matrix;
wherein the matrix is substantially composed of a PbTe compound,
wherein the inclusions are composed of elemental Pb; and
wherein the inclusions comprise nanoscale inclusions having a maximum dimension between about 10 and 35 nanometers and present in an amount greater than about 50 percent by volume, based on the total volume of inclusions.

9. A thermoelectric material in accordance with claim 8 wherein the material comprises silver in an amount sufficient to form an excess of Pb over stoichiometric amounts required to from PbTe.

10. A method for forming a thermoelectric material comprising
forming a melt comprising M and A adapted to form MA compound, wherein M is selected from the group consisting of Pb, Sn and Ge, and A is selected from the group consisting of Te, Se and S; and further wherein said M is present in an amount greater than a stoichiometric amount for forming the MA compound; and
solidifying the melt to produce a thermoelectric material having a microstructure characterized by nanoscale inclusions dispersed in a matrix substantially composed of MA compound, said nanoscale inclusions being composed of elemental M and having a maximum dimension less than 100 nanometers, whereby said nanoscale inclusions are present in an amount up to about 33 percent by volume.

11. A method in accordance with claim 9 wherein the melt comprises M in excess of the stoichiometric amount and sufficient to form between 3 and 20 percent nanoscale inclusions.

12. A method in accordance with claim 9 wherein the solidifying step comprises cooling the melt at a rate sufficient to form the inclusions.

13. A method in accordance with claim 9 wherein the solidifying step comprises solidifying the melt to form a solid solution and thereafter heating the solid solution at a temperature and for a time sufficient to form the nanoscale inclusions.

14. A method for forming a thermoelectric material comprising
forming a melt comprising Pb and Te, said Pb being present in an amount greater than a stoichiometric amount for forming the PbTe compound; and
solidifying the melt to produce a thermoelectric material having a microstructure characterized by nanoscale inclusions dispersed in a matrix substantially composed of PbTe compound, said nanoscale inclusions being composed of elemental Pb, wherein at least 50 percent by volume of the nanoscale inclusions have a maximum dimension between about 10 and 35 nanometers.

15. A method in accordance with claim 14 wherein the melt is formed by adding Pb in an amount greater than the stoichiometric amount.

16. A method in accordance with claim 14 further comprising adding to the melt a tellurium getter in an amount sufficient to produce Pb in excess of the stoichiometric amount.

17. A method in accordance with claim 16 wherein the tellurium getter is silver.

18. A method in accordance with claim 14 wherein the step of solidifying the melt comprises cooling the melt to form a solid solution and thereafter heating the solid solution for a time and at a temperature sufficient to form the nanoscale inclusions.

* * * * *